(12) United States Patent
Sul et al.

(10) Patent No.: US 8,841,974 B2
(45) Date of Patent: Sep. 23, 2014

(54) TEST SOLUTION FOR RING OSCILLATORS

(75) Inventors: Chinsong Sul, Santa Clara, CA (US); Hyukyong Kwon, Dublin, CA (US); Andy Ng, Hayward, CA (US)

(73) Assignee: Silicon Image, Inc., Sunnyvale, CA (US)

(*) Notice: Subject to any disclaimer, the term of this patent is extended or adjusted under 35 U.S.C. 154(b) by 0 days.

(21) Appl. No.: 13/605,708

(22) Filed: Sep. 6, 2012

(65) Prior Publication Data

US 2014/0062606 A1 Mar. 6, 2014

(51) Int. Cl.
*H03K 3/03* (2006.01)

(52) U.S. Cl.
CPC .................................. *H03K 3/0315* (2013.01)
USPC .............. 331/57; 324/527; 324/765; 714/726; 708/250; 708/251; 331/78

(58) Field of Classification Search
CPC ....... G01R 31/26; G01R 31/28; H03L 7/0995
USPC .................. 702/79, 69; 716/113, 108; 331/57; 324/765, 527, 158.1; 257/48; 714/734, 714/726, 724; 708/250, 251
See application file for complete search history.

(56) References Cited

U.S. PATENT DOCUMENTS

| 5,341,096 A * | 8/1994 | Yamamura ................. 324/750.3 |
| 6,798,230 B1 * | 9/2004 | Taylor et al. ............... 324/750.3 |
| 7,532,078 B2 * | 5/2009 | Agarwal et al. ................. 331/57 |

* cited by examiner

*Primary Examiner* — Arnold Kinkead
(74) *Attorney, Agent, or Firm* — Fenwick & West LLP

(57) ABSTRACT

A method and apparatus is disclosed herein for testing of multiple ring oscillators. In one embodiment, the apparatus comprises at least one ring oscillator structure having a ring oscillator having an inverter chain with an odd number of inverters connected back-to-back and operable to produce an oscillatory output, and a test structure coupled to provide either an observability chain input or a test input to the ring oscillator and to receive the oscillatory output as a feedback from the ring oscillator.

19 Claims, 10 Drawing Sheets

US 8,841,974 B2

TEST SOLUTION FOR RING OSCILLATORS

FIELD OF THE INVENTION

Embodiments of the present invention relate to the field of ring oscillators; more particularly, embodiments of the present invention relate to testing of multiple ring oscillators, such as may be employed in a random number generator for secret key generation in high-definition content protection (HDCP).

BACKGROUND OF THE INVENTION

Randomness is found a critical role in cryptography for ensuring security of data transmission. In order to implement randomness in hardware, metastability of flip-flop or a clock jitter is used as a source of randomness. Many of the implementations employ ring oscillators as a clock. A large number of ring oscillators are often employed to maintain a required level of randomness. There are 256 ring oscillators used in the HDCP 2.0 for a secret key generation for a safe data transmission.

FIG. 1 illustrates a simplified view of data encryption in HDCP. Referring to FIG. 1, secret key 101 is constructed from a random number generated from True Random Number Generator (TRNG) 102. The random number is used to calculate the secret keys both at the source and the sink. The random number is generated first from the source and the secret key is computed. At the same time, the random number can be transmitted to the sink so that it can calculate its own secret key. The source encrypts the video stream, video data 110, using the secret key via the XOR operation 120 and encrypted video stream 111 is transmitted to the sink. The sink uses its own secret key to decrypt the received encrypted video stream 111.

TRNG 102 employs a large number of ring oscillators to generate the random number. FIG. 2 illustrates an example of a TRNG. Referring to FIG. 2, ring oscillators (ROs) $201_{1-N}$ are the odd number of inverters 210 connected back-to-back through the combinational feedback as shown. The outputs of ring oscillators $201_{1-N}$ are combined using XOR logic 202 and the output of XOR logic is connected to flip-flop 203. The sampling clock $F_s$ is provided to capture a stream of the output of XOR logic 202 in order to obtain the random numbers.

Due to an inherent combinational feedback in ring oscillators $201_{1-N}$, testing of each of ring oscillators $201_{1-N}$ using the economical structural tests such as the stuck-at test can be difficult. Often, ring oscillators $201_{1-N}$ are functionally tested one at a time in isolation. Such conventional ring oscillator tests can involve observation of the ring oscillator output directly at the tester or employment of some on-chip counters to detect the oscillation produced by the ring oscillator under test. Testing the output of ring oscillator at the tester may be costly due to asynchronous nature of ring oscillator and inefficient test access. The test method employing the on-chip counters may suffer from hardware and test time overhead due to a test setup of each individual ring oscillator.

Thus, cost of the functional test can be substantial if a number of ring oscillators is large and is increasing. It is critical to provide low cost test solutions that are not cost sensitive to the increase in problem size, i.e. the number of employed ring oscillators, especially when the price of commercial ICs is continuously under the pressure but their cost of test persists if not increasing.

SUMMARY OF THE INVENTION

A method and apparatus is disclosed herein for testing of multiple ring oscillators. In one embodiment, the apparatus comprises at least one ring oscillator structure having a ring oscillator having an inverter chain with an odd number of inverters connected back-to-back and operable to produce an oscillatory output, and a test structure coupled to provide either an observability chain input or a test input to the ring oscillator and to receive the oscillatory output as a feedback from the ring oscillator.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
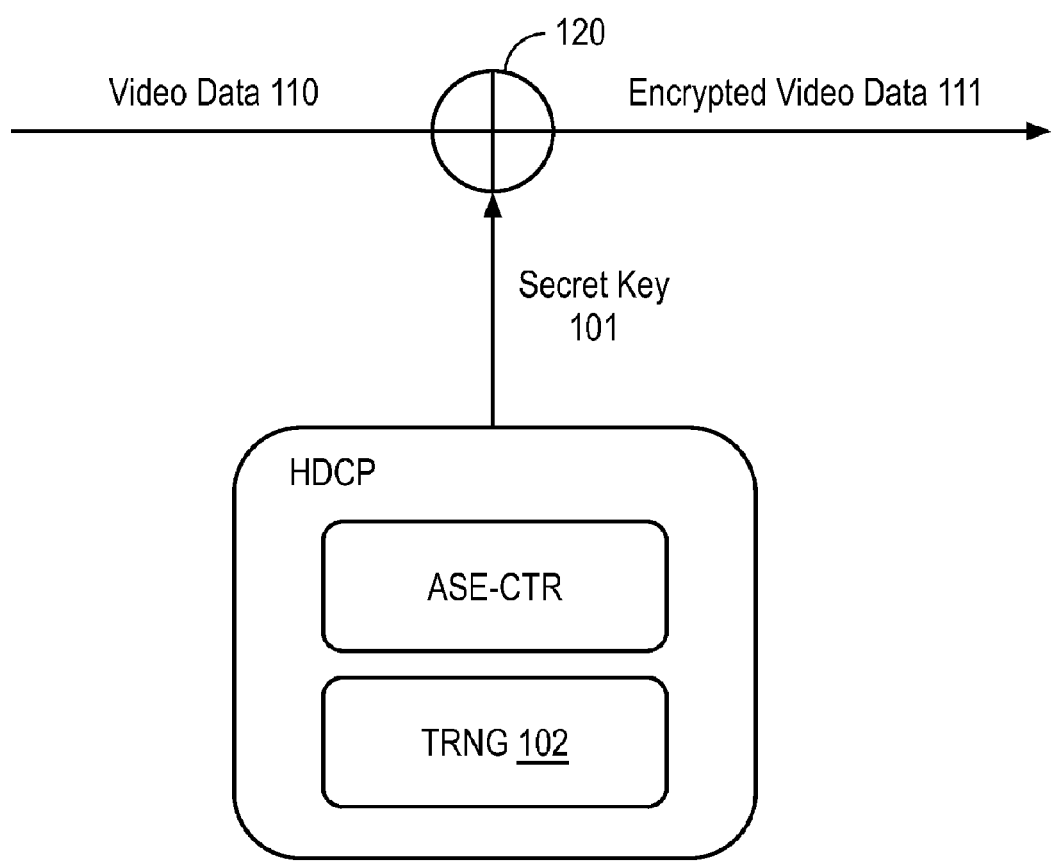
FIG. 1 illustrates data encryption in HDCP.
Figure 2:
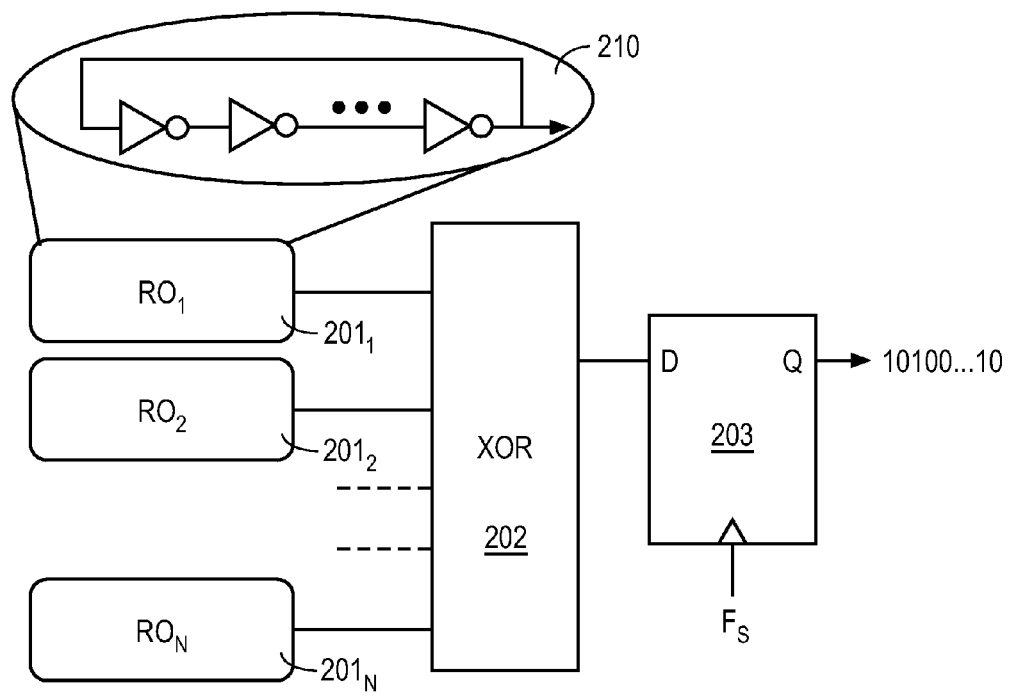
FIG. 2 illustrates an example of a true random number generator (TRNG).

A scheme for testing a large number of ring oscillators employed in a true random number generator for a secret key generation in the HDCP (high-definition content protection) for video encryption and decryption is described. In one embodiment, using the disclosed on-chip ring oscillator test solution, all of the ring oscillators can instantly be tested for oscillation by the stuck-at structural test or a proposed pseudo-functional test. In one embodiment, the test structure is modular and a collection of test structures, when connected, construct a test access for a parallel test of ring oscillators, characterization and silicon debug. An advantage of the test solution described herein is a fast determination of defective parts before a detailed performance specification test so that overall manufacturing test time can be reduced.

In one embodiment, the described ring oscillator testing scheme can eliminate test cost of a large number of ring oscillators by testing them with other system logic during the structural test or reduce the test cost to an insignificant level (i.e., delay of inverter chain in ring oscillators), if they are tested in isolation. In one embodiment, the ring oscillator testing scheme achieves the goal by transforming the existing ring oscillator into a more testable form referred to herein as a "ring oscillator test structure". The ring oscillator test structure can reconfigure the ring oscillators into a testable structure that allows the structural stuck-at test and a parallel functional test of ring oscillators. The described scheme can reduce the test time increase to an insignificant level for the greater number of ring oscillators.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMS), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

In one embodiment, the ring oscillator architecture has at least one ring oscillator structure, and each ring oscillator structure has a ring oscillator and a test structure. The ring oscillator has an inverter chain with an odd number of inverters connected back-to-back and operable to produce an oscillatory output. The test structure is coupled to the ring oscillator and provides either an observability chain input or a test input to the ring oscillator and receives the oscillatory output as a feedback from the ring oscillator. In one embodiment, the test structure is operable to reconfigure the ring oscillator into a testable structure to allow one or more of a structural stuck-at test and a functional test of the ring oscillator to validate whether the ring oscillator can produce an intended oscillating frequency within a specified jitter limit. In one embodiment, the ring oscillator architecture also includes an AND gate having a pair of inputs and an output, and the output is coupled to the input of the ring oscillator.

In one embodiment, the test structure is responsive to a plurality of control signals. In one embodiment, one of the control signals includes a test control signal from a register internal to the ring oscillator architecture. In one embodiment, one of the control signals includes is a ring oscillator test mode signal that indicates whether the ring oscillator under test is in functional mode or test mode.

In one embodiment, each ring oscillator structure comprises a group of ring oscillator structures connected in a serial chain, wherein a test output of a last of the ring oscillator test structures in the serial chain is fed back for use with the test input to a first ring oscillator structure in the chain. In one embodiment, the serial chain contains an odd number of inverters. In one embodiment, each ring oscillator structure further comprises a gate to conditionally activate a feedback path to feed back the test output based on a feedback enable signal. In one embodiment, each ring oscillator structure further comprises an XOR gate to XOR the test output fed back from the last of the test structures with the test input. In one embodiment, one or more ring oscillators (less than all) is selected for testing by asserting an enable signal of each of the ring oscillators being tested.

Figure 3:
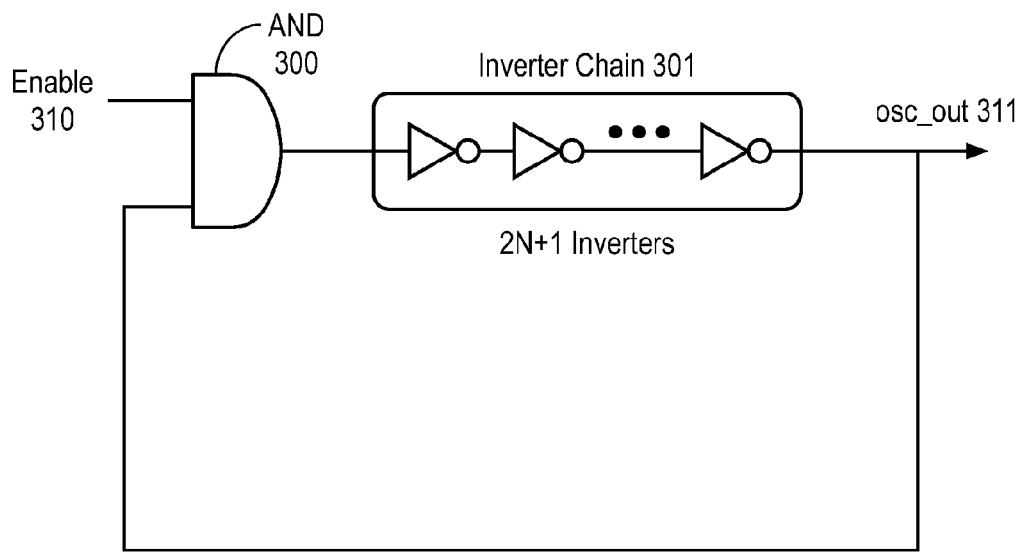
FIG. 3 illustrates a functional view of prior art ring oscillator.

FIG. 3 illustrates one embodiment of a ring oscillator. Referring to FIG. 3, the function of ring oscillator is to produce oscillating output at osc_out 311. The oscillating output, osc_out 311, can be used to provide a clock to the on-chip circuitry and employed in generation of random numbers for encryption and decryption. The ring oscillator in FIG. 3 shows a functional view of the ring oscillator. In one embodiment, the ring oscillators are implemented in analog circuits. In another embodiment, the ring oscillators are implemented with digital circuits. A ring oscillator can functionally be viewed as an odd number of inverters (2N+1) with a combinational loop-back enabled by an enable signal 310 via AND gate 300. If the enable signal 310 equals 1, the ring oscillator can produce an oscillating output at osc_out 311. Otherwise, the output can be fixed at the logical state, for example, the osc_out 311 equals ~Enable, where the symbol ~denotes a logical negation. The behavior of ring oscillator shown in FIG. 3 can be summarized as "forever osc_out=Enable? (~osc_out:1)." If the Enable signal 310 equals 0, then osc_out 311 equals 1 because of odd number of inversions. Otherwise, osc_out 311 can continuously complemented in order to produce the oscillating output at osc_out 311.

Because test constraint and requirement can be different from application to application, the focus of interest in testing for each application can be different. In order to test a large number of ring oscillators employed in cryptography, for example, validating the capability of producing the oscillating output may be of greater importance than the detailed performance analysis from an economic point of view. As long as the ring oscillators can oscillate, they may successfully be made to serve as a source of randomness to generate the random numbers. Thus, in testing of ring oscillators used in the random number generation, for example, the function of oscillation may be targeted prior to the detailed performance spec test. If necessary, however, the detailed performance spec test can be followed after testing their basic functionality.

The described ring oscillator scheme can provide the test access for the performance test. The performance spec test is to validate if the ring oscillator can produce an intended frequency of oscillating output within the specified jitter limit. Testing of basic functionality of ring oscillators may not have to be performed at functional speed but at slower speed if the test quality and the test cost benefit can be justified. When the functional test is performed at rates different than the performance spec, the test is called a pseudo-functional test. In order to achieve the pseudo-functional test at various frequencies, the period of ring oscillator may need to be controllable by test engineers.

In one embodiment, the pseudo-functional test is implemented by a test control mechanism embedded in the ring oscillator. The test control mechanism allows the frequency of ring oscillator to be controlled from the primary input during the test. Using the provided test control, the ring oscillator is forced to operate at any allowable frequencies possibly below and beyond its spec frequency. This feature can be useful in testing of the ring oscillators for their basic functionality and can also be useful in implementing structural test of ring oscillators.

In general, functional tests do not involve fault models. A fault model can be viewed as a logical representation of a physical defect. There are different fault models available to model behavior of physical defects. Fault models can aid in determining a reason for the behavior of defects at the level of abstraction provided by the underlying the fault models. One of putative fault model is a stuck-at fault model. The stuck-at fault model can represent physical defects resulted from being shorted to a power VDD (modeled as stuck-at logical 1 or SA-1) and to a ground GND (modeled as SA-0). In this fault model, the SA-0 and the SA-1 faults are assumed at each port of a gate.

In the following, one embodiment of a ring oscillator (RO) test structure is described. The constructed test access from the RO test structure is also discussed along with construction of the hierarchical ring oscillator test structure. In one embodiment, the test access is formed by connecting the RO test structures in a serial fashion. In one embodiment, the hierarchical RO is constructed from the test access by establishing back-to-back connection from the input of RO chain to the output forming a larger RO. In one embodiment, the hierarchical RO contains all ring oscillators included in the RO chain. The hierarchical RO can be tested the same way as the individual RO and can be used to detect a gross delay defect. Thereafter, in the description below, a pseudo-functional test is discussed, followed by a structural test. Both tests are performed through the disclosed test access.

One Embodiment of a Proposed Ring Oscillator Test Structure

In order to control asynchronous behavior of the ring oscillator during the test, a test point can be incorporated into the ring oscillator so that the output of ring oscillator can be changed under the control of test input. Hence, the frequency of the ring oscillator can be controlled from the test input.

Figure 4:
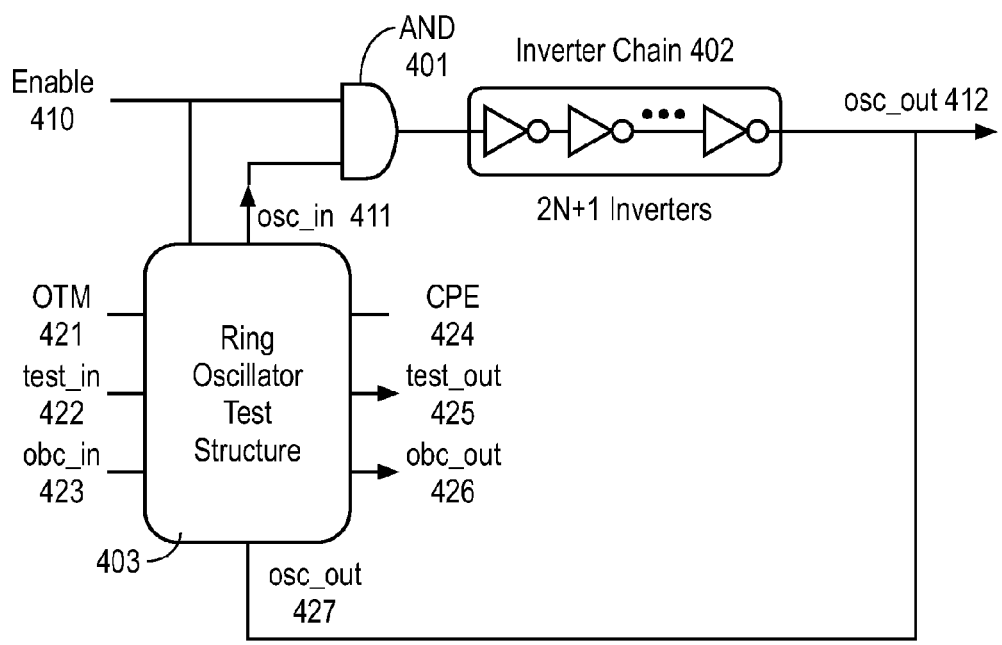
FIG. 4 illustrates one embodiment of a ring oscillator apparatus having a ring oscillator test structure (TS).

FIG. 4 is one embodiment of a RO test structure. The RO test structure can be placed anywhere in the ring oscillator. Referring to FIG. 4, the RO test structure comprises an AND gate 401, inverter chain 402, and RO test structure 403. Enable signal 410 is coupled to one input of AND gate 401 and an input of RO test structure 403. The other input of AND gate 401 is coupled to osc_in 411 output from RO test structure 403. The output of AND gate 401 is coupled to the input of inverter chain 402. In one embodiment, inverter chain 402 comprises an odd number of inverters (e.g., 2N+1 inverters). The output inverter chain 402, and the RO, is osc_out 412, and is also coupled to a osc_out input 427 of RO test structure 403.

Osc_out 412 can be connected to osc_in 411 through the input of AND gate 401 via RO test structure 403. In one embodiment, at initialization, osc_in 411 is reset to logical 1, providing a non-controlling logic value to AND gate 401, and hence, enable signal 410 can be observed at osc_out 412.

The disclosed testable oscillators can incorporate global test control signals to orchestrate the ring oscillator test. In one embodiment, the test control signals are provided from the internal registers which can be accessed via a widely known IO interfaces (e.g., I2C, IEEE STD 1149.1 Boundary Scan, etc.). In one embodiment, in case of the structural stuck-at test, the test input signal are provided from the internal register and the test output is also captured into the internal register as well.

Ring oscillator test mode (OTM) signal 421 determines whether the ring oscillator under test is in functional mode or test mode. In functional mode, where OTM 421 equals 0, the test structure is quiescent and has no effect on the function of ring oscillator. In the test mode, the control point enable (CPE) 424 determines whether the ring oscillator can be run at a free running or at a test input controlled frequency. If the control point is enabled (i.e., CPE 424 equals 1), for example, the frequency of ring oscillator depends on the frequency of test input (test_in 422). Otherwise, the ring oscillator can be run at a free running or at functional speed if the RO is enabled. In one embodiment, CPE 424 is assumed to be gated with OTM 421 at the top level so that it can be disabled (i.e., CPE 424 equals 0) when the OTM 421 equals 0.

In one embodiment, the observability chain input (obc_in) 423 and output (obc_out) 426 are used to observe the faults on enable signal 410 and osc_out 412. Osc_in signal 411 and osc_out signal 412 are the input and the output of the inverter chain, respectively. If enable signal 410 equals 1, then osc_out 412 equals ~osc_in. Otherwise, osc_out 412 equals ~Enable or logical 1. The test output (test_out 425) is a duplicate of osc_in 411. Osc_out 412 can be passed to osc_in 411 under the control of test_in 422.

In one embodiment, the test structure is initialized when OTM 421 equals 1, CPE 424 equals 0 and enable signal 410 equals 0. At initialization, the test input (test_in 422) is assumed to be set to the same signal state as the osc_in 411, i.e. test_in 422 equals 1, and osc_out 412 equals ~Enable. If CPE 424 equals 1 and Enable signal 410 equals 1, then osc_in 411 can track changes of test_in 422. Since the oscillator output (osc_out 412) is an inverted output of osc_in 411, the change of osc_out 412 is directly controlled by test_in 422.

Figure 5:
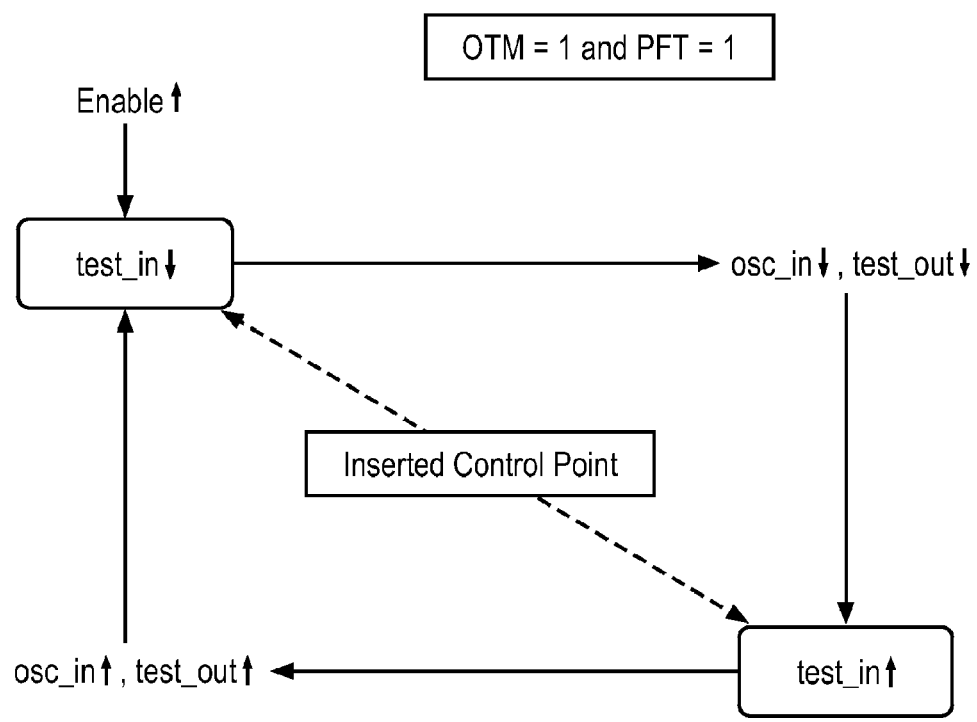
FIG. 5 illustrates behavior of one embodiment of a ring oscillator test structure.

Behavior of the ring oscillator test structure during the test is shown in FIG. 5. When the OTM 421 equals 1 and the CPE 424 equals 1, the frequency of the ring oscillator can be controlled from the inserted test point. If enable signal 410 equals 1, the ring oscillator is enabled and waiting for test_in 422 to change its signal state. The output of ring oscillator remains unchanged until test_in 422 is changed. In one embodiment, every signal transition of test_in 422, either low-to-high or high-to-low, causes the oscillator to produce the same signal transition at the both osc_out 412 and the test_out 425. Hence, the output of ring oscillator can be measured or observed reliably under the control of test_in 422. Note that the ring oscillator is operated at the frequency of test_in 422 during the test.

Figure 6A:
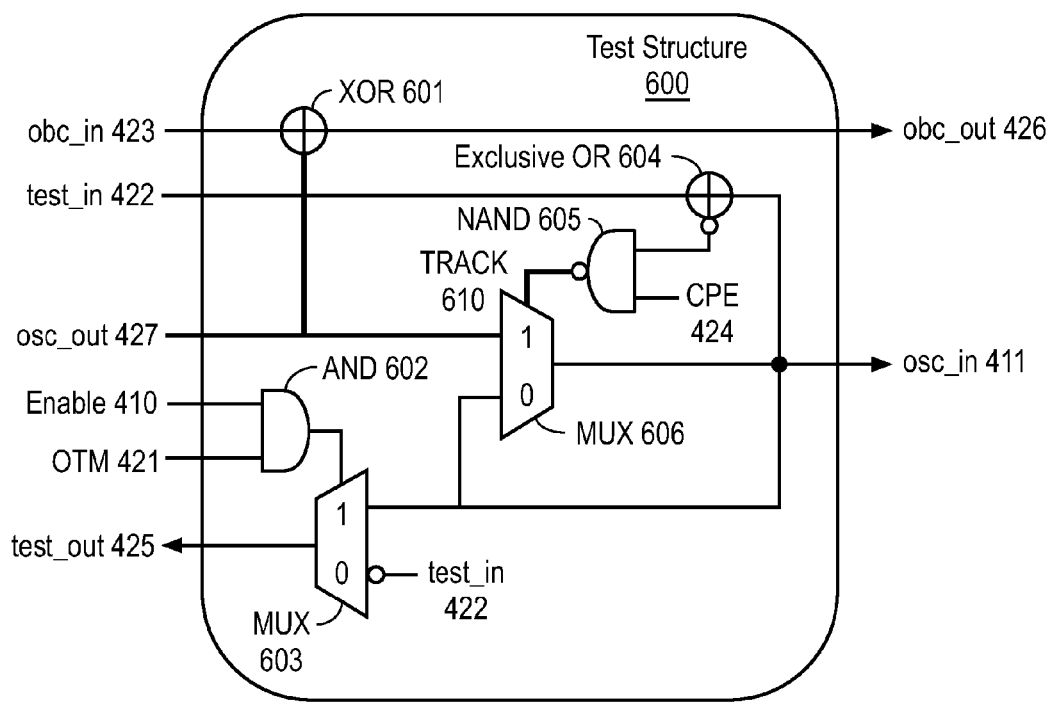
FIG. 6A illustrates one embodiment of a test structure used as part of a ring oscillator apparatus.

FIG. 6A is one embodiment of a ring oscillator test structure. The ring oscillator equipped with the test structure 600 is referred to herein as a testable ring oscillator (TRO). OTM 421 activates the test structure for test and deactivates the test structure for normal functional mode. If OTM 421 equals 1 and CPE 424 equals 1, the ring oscillator is under the control of the test structure. Otherwise, the ring oscillator is free-running.

Multiplexor 606 is inserted between osc_out 427 and osc_in 411 in order to implement the control point. Multiplexor 606 outputs osc_out 427 or the latched output to osc_in 411 depending on the signal state of TRACK 610, which is coupled to its selection input. TRACK 610 is enabled by CPE 424 which is coupled to an input NAND gate 605 (where the output of exclusive XOR gate 604 is coupled to the other input of NAND 605). When the CPE 424 equals 1, TRACK 610 is determined by the signal states of test_in 422 and osc_in 411. If their signal states are the same, TRACK 610 equals 0, and otherwise, TRACK 610 equals 1. If TRACK 610 equals 1, the functional path is established by connecting osc_out 427 to osc_in 411. If TRACK 610 equals 0, a latch can be formed by a combinational feedback through multiplexor 606. The latch can be initialized asynchronously into the same logical state as test_in 422 after three logic gate delay (gates through 1 to 3). The latch can be in transparent if OTM 421 equals 0 or the CPE 424 equals 0.

A bypass multiplexor (MUX) 603 can implement the proposed test access. The bypass multiplexors can allow the disabled ring oscillators to be excluded from the test. Bypass MUX 603 is controlled by Enable signal 410, which is coupled to one input of AND gate 602 that has an output coupled to the selection input of MUX 603. The input of AND gate 602 is coupled to OTM 421. Bypass MUX 603 configure the test path during the test. If the Enable=1, the ring oscillator output can be connected to test_out 425. Otherwise, test_in 422 can be bypassed directly to test_out 425. Note that the complementary inputs are used at bypass multiplexor 603 in order to increase testability. That is, osc_in 411 equals test_in 422 at steady-state. The steady-state can be defined as the signal state at which the output is at the valid logical state and remains unchanged unless the input is changed.

The bypass feature can also be useful in both characterization and silicon debug. In characterization, any ring oscillator can be characterized in isolation by bypassing all other ring oscillators. Similarly, a suspected ring oscillator can be tested in isolation or the faulty TRO can be bypassed for further diagnosis.

Figure 6B:
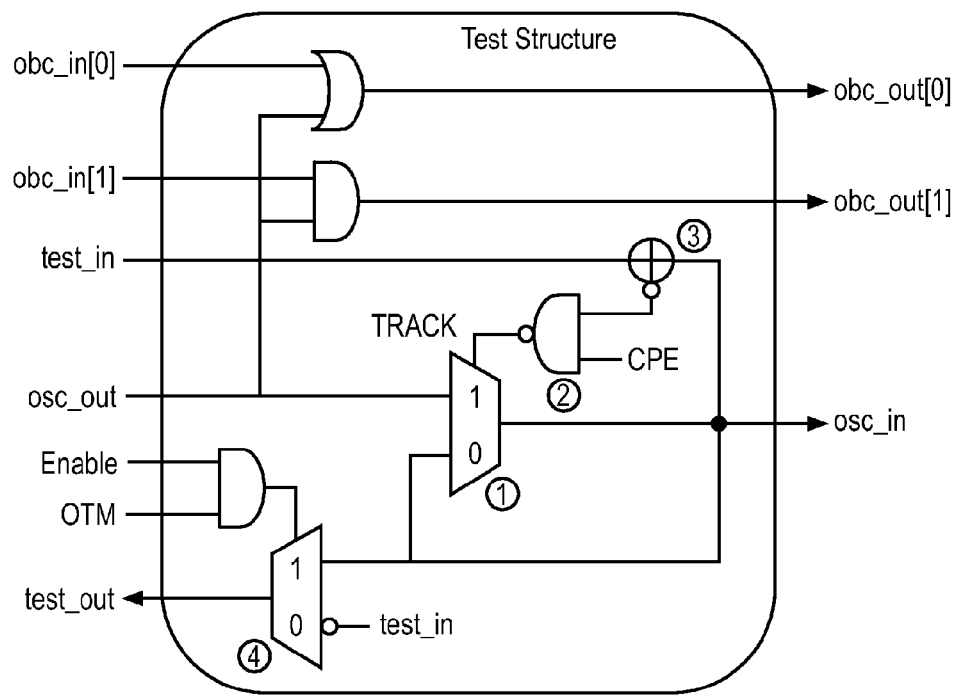
FIG. 6B illustrates another embodiment of the test structure.

XOR gate 601 of the observability chain has an input coupled to obc_in 423 and osc_out 427 and outputs obc_out 426. In one embodiment, XOR gate 601 is used to detect the SA faults at enable signal 410 and osc_out 427. Enable signal 410 can be tested at steady-state when the CPE 424 equals 1. Enable signal 410 can be disabled and enabled for SA-1 test and SA-0, respectively. If enable signal 410 equals 0, then osc_out 427 equals 1 and obc_out 426 equals ~obc_in. Otherwise, obc_out 426 equals obc_in 423. Thus, any SA fault on enable signal 410 which violates the obc chain behavior can be detected at obc_out 426. In one embodiment, use of the XOR gate implies that a number of detectable SA faults observed at the output of the gate must be an odd. If, for example, both obc_in 423 and the enable path are faulty, those even number faults are masked at the output of XOR gate 601. If any number of SA fault detection were required, the single-bit obc structure can be replaced with a two-bit employing the AND logic in one bit and the OR logic in the other to increase test coverage. As a result, the one-bit obc_in and obc_out are expanded to two-bit obc_in[1:0] and obc_out[1:0]. When the test_in=1, all stuck-at-0 and 1 faults on the Enable signals can be detected through the stuck-at-1 and 0 faults at the osc_out respectively, if all ring oscillators were enabled and disabled, respectively. This is illustrated in FIG. 6B.

The latch can be initialized to hold logical 1 prior to the enable test. This can ensure osc_in 411 equals 1, providing a non-controlling value to the input of AND gate 602 so that its output can solely be determined by enable signal 410. If, for example, the OTM 421 equals 1, CPE 424 equals 1 and test_in 422 equals 1 for all ring oscillators, a SA fault on the Enable signal path (410) can complement obc_out 426 and hence detected.

Figure 7:
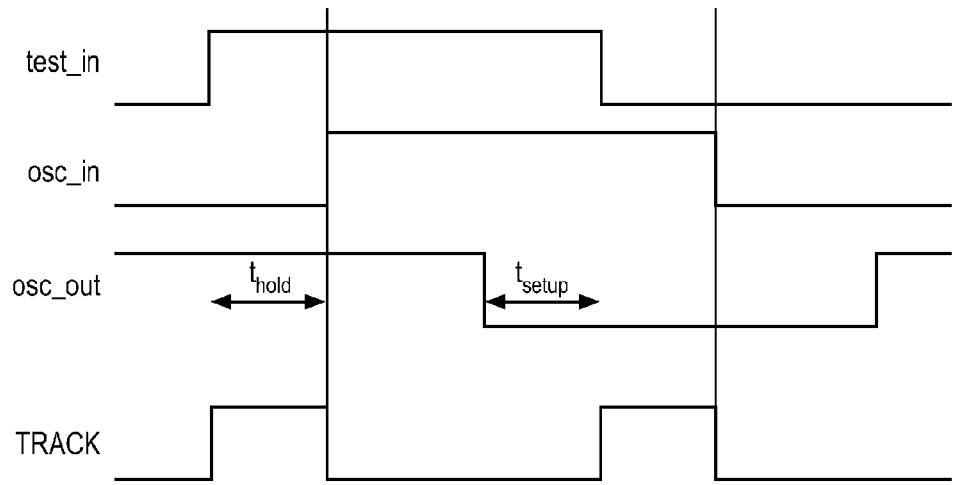
FIG. 7 illustrates setup and hold times of one embodiment of a test structure.

Since the test structure can form a latch if TRACK 610 equals 0, the latch is subject to the setup time and the hold time constraints as shown in FIG. 7. The setup time and the hold time specify durations of which osc_out 427 (412) should be stable. Since the transition of test_in 422 can cause that of osc_out 427, the timing constraints can easily be met if a delay of inverter chain in the oscillator is larger than the hold time.

Figure 8:
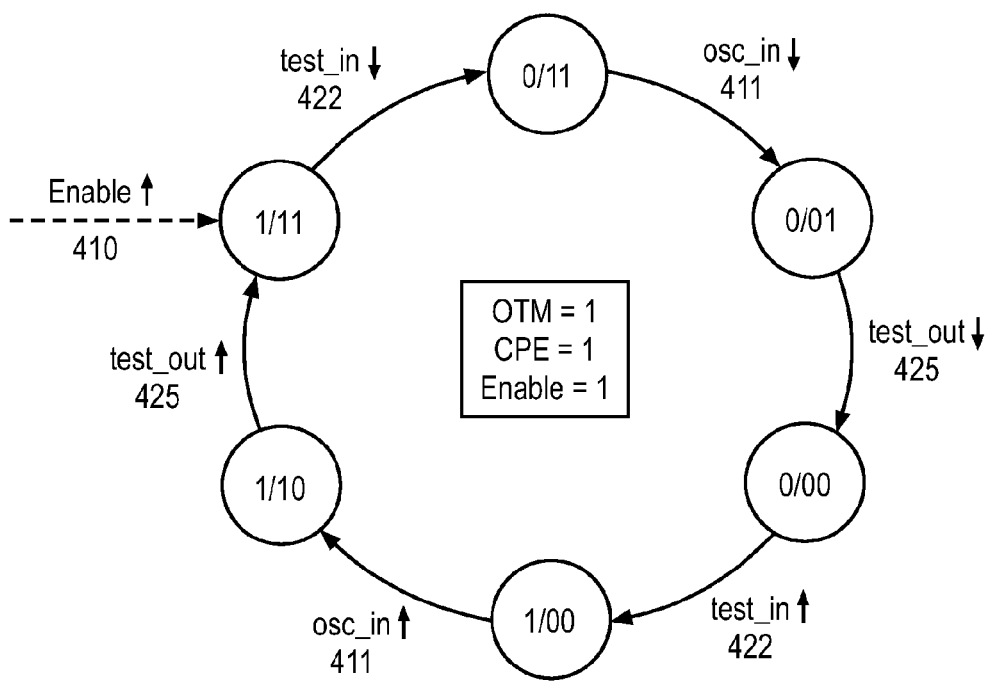
FIG. 8 illustrates asynchronous FSM describing test sequence for one embodiment of a test structure.

FIG. 8 depicts the behavior of the TRO during the test can be described by an asynchronous finite state machine (AFSM). Referring to FIG. 8, the upward and the downward arrows denote signal transitions from logical 0 to 1 and 1 to 0, respectively. The signal transition from logical 0 to 1 and 1 to 0 are called a high and low transitions respectively. The state is enumerated with the signal states of input and output signals in the order of test_in 422, osc_in 411, and test_out 425. The backslash symbol is used to separate the inputs of the test structure from the outputs. For example, after initialization (i.e., OTM 421 equals 1, CPE 414 equals 0 and enable signal 410 equals 0), test_in=1, osc_in=1 and the test_out=1 (or, 1/11).

Enable 410 is assumed to be disabled (i.e. Enable 410 equals 0) at start. At the state 1/11 when CPE 424 equals 1 and test_in 422 equals 1, the test can be initiated by Enable 410 equal to 1. If enable signal 410 equals 1, the test structure is at the 1/11 state and is waiting for the low transition of test_in 422. In the 1/11 state, both osc_in 411 and test_in 422 are in the same logical state so that TRACK 610 equals 0 which blocks the functional path from osc_out 427 to the osc_in 411. Osc_out 427 (and test_out 425) is updated with the complementary signal state of osc_in 421 via the invertor chain.

When test_in 422 equals 0, the state is changed to the 0/11 state. The signal state of inputs causes the high transition of TRACK 610. When TRACK 610 equals 1, osc_out 427 is connected to osc_in 411 so that osc_in 411 can be complemented. The state of the test structure is advanced to the 0/01 state. The state of TRACK 610 equal to 0 and the updated signal state of osc_in 411 can be latched. At the same time, test_out 425 can follow osc_in 411 and the state is changed to the 0/00 state. When TRACK 610 equals 0, osc_out 427 is changed to 1 after the inverter chain delay. The change of osc_out 427 is blocked by multiplexor 606 and is not propagated to osc_in 411. The test structure can be standstill until test_in 422 changes. This process can be repeated for the opposite transitions of input and output signals. Similarly, the entire test process can continue if OTM 421 equals 1, the CPE 424 equals 1 and enable signal 410 equals 1.

Figure 9:
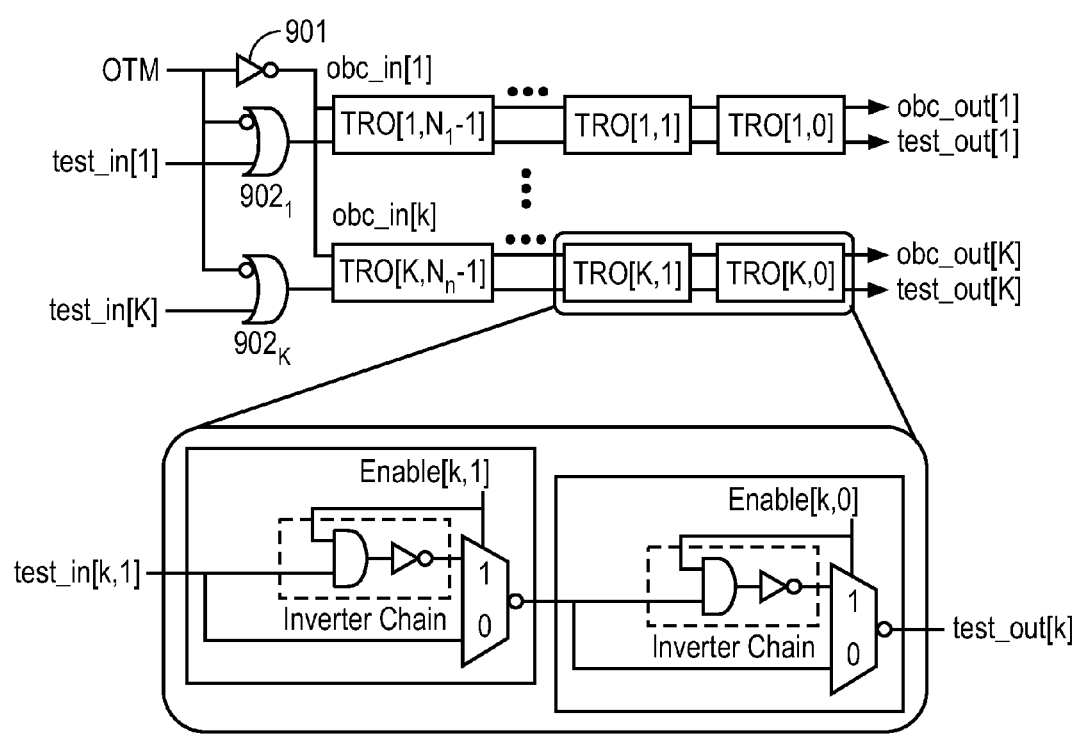
FIG. 9 illustrates one embodiment of test access for a ring oscillator test.

In one embodiment, the test structures are connected in a serial fashion via test_in 422 and test_out 425 to form a hierarchical test structure. The hierarchical test structure functions as a test access for characterization and silicon debug. FIG. 9 illustrates an example of constructed test access. The test_in and the test_out can function as test access ports. Each chain of TROs is referred to herein as a testable oscillator chain (TOC). Referring to FIG. 9, each TRO chain has two inputs, an obc_in input and a test_in input. For the TOC, the obc_in input and the test_in input come from the preceding TRO in the chain with the exception of the first TRO in the chain. The inputs to the first TRO in the chain, such as TRO $[1, N_1-1]$, are coupled to the output of inverter 901 and output of OR gate, such as OR gate $902_1$. The input of inverter 901 is coupled to the OTM signal, which is also coupled to one negated input of OR gates $901_{1-K}$. The other input of OR gates $902_{1-K}$ is coupled to a test_in signal.

In one embodiment, any number of ring oscillators in a hierarchical test structure can be tested and characterized in isolation if a dedicated Enable signal can be provided to each ring oscillator. The Enable signal of each ring oscillator can be used to determine or to program engagement and disengagement of the TRO for test. The multiplexor 603 in the test structure shown in FIG. 6 can be set to exclude or bypass the disengaged ring oscillators from the test. For example, CPE 424 equal to 0 for characterization and each ring oscillator can be enabled one at a time by programming the Enable signals so that its functional behavior can be observed at the test_out via the instruments such as electronic scopes and the ATE.

Figure 10:
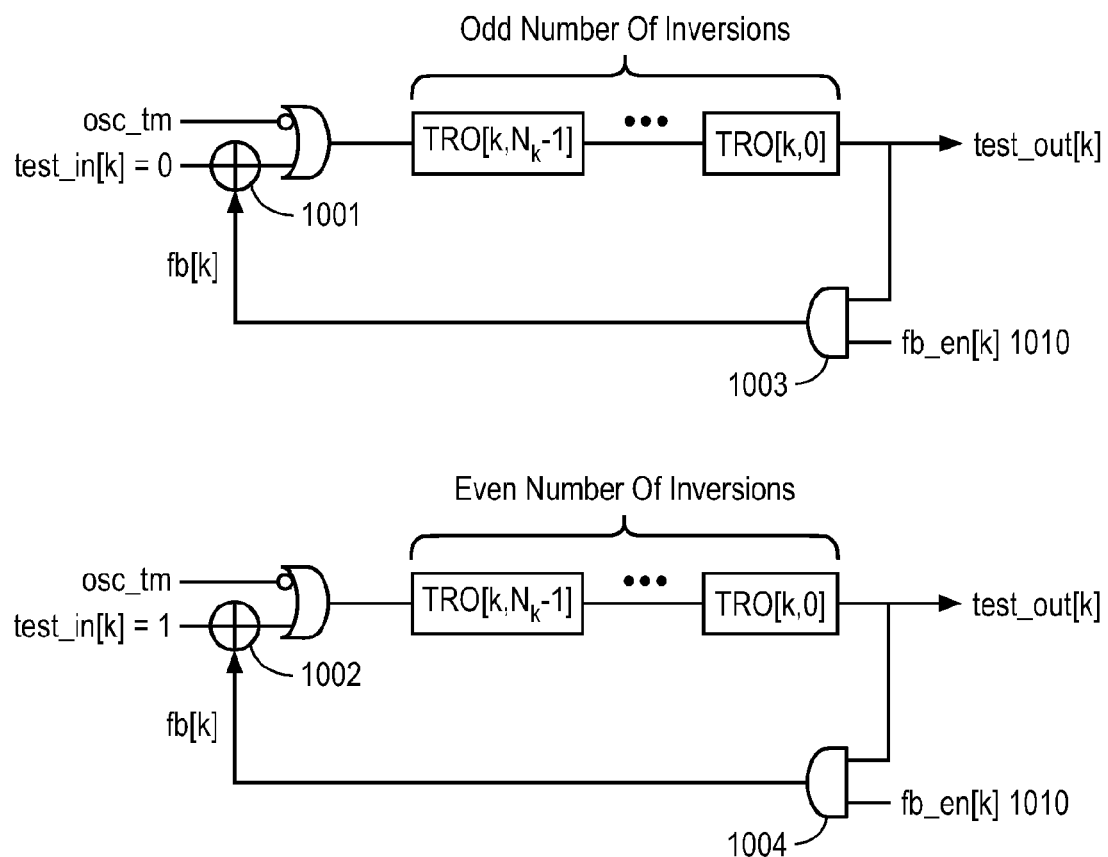
FIG. 10 illustrates one embodiment of a hierarchical ring oscillator test structure.

A hierarchical RO test structure (or a hierarchical test structure for short) can be constructed from the proposed test access by establishing a feedback connection from the test_out[k] to the test_in[k] via the XOR gate (1001, 1002) as shown in FIG. 10. The feedback control signal fb_en[k] can be incorporated using the AND gate (1003, 1004) to conditionally activate the feedback loop. The feedback can be enabled if the fb_en[k] 1010 equals 1 and disabled, otherwise. If the feedback is enabled, the hierarchical ring oscillator can be configured with the feedback loop established by the test_in[k, Nk-1] equal to test_in[k] $\oplus$ fb[k]. Note that the test_in [k] can function as a control input to complement the fb[k].

In one embodiment, the hierarchical ring oscillator consists of the inverter chains of all enabled ring oscillators. To function as a ring oscillator, the number of inversions in the hierarchical ring oscillator must be an odd. The odd number of inversions required for the ring oscillator can be provided by the signal state of test_in[k] as shown in FIG. 10. During the test, if the number of enabled TROs in a given hierarchical test structure is odd, no extra inversion is necessary. If, however, it is even, then the test_in=1 in order to provide the required inversion. If the fb_en[k]=0, the hierarchical test structure can be reduced to the test access structure, as expected.

The hierarchical test can be run autonomously without interaction of the test input (test_in[k]). In this test, only the output test_out[k] may need to be measured for the test decision. Since the hierarchical test structure can include any set of enabled ring oscillators, this test may not only validate functionality of the ring oscillators but may also detect a gross delay defect among them. If, for example, the frequency of hierarchical ring oscillator is lower than a test limit, the delay defect can be concluded. The proposed hierarchical RO can also be employed in the silicon wafer process characterization. By enabling any number of TROs, the hierarchical RO can be used to correlate working wafers and out-of-spec wafers from its delay and jitter characteristic.

The disclosed ring oscillator test structure can be employed by the various test methodologies such as the structural test and the pseudo-functional test in order to increase testability of massive number of ring oscillators on chip. Since the structural test to be similar to the pseudo-functional test in terms of test procedure or steps, the pseudo-functional test is discussed primarily and the structural test is discussed reference to the pseudo-functional test.

A pseudo-functional test can be carried out using the ring oscillator test structure and this is discussed below.

Pseudo-Functional Test of Ring Oscillators

With an aid of the disclosed test structure and the test access, a pseudo-functional test can be run at any speed if both the setup and the hold time are met. In one embodiment, the disclosed scheme assumes that an odd number of ring oscillators are enabled for any given test. The odd number of ring oscillators can reflect the fault detection feature embedded in the disclosed test access. In one embodiment, the disclosed scheme uses two global enable signals and each enable signal (e.g., enable signal 410) can be shared by an odd number of ring oscillators. Any number of enable signals, however, can be employed and each enable signal can be shared by any number of ring oscillators. In one embodiment, a separate enable signal is available for each ring oscillators. Alternatively, a single enable can be employed for all ring oscillators. One embodiment of the pseudo-functional test using the test access structure is summarized as follows.

---

Pseudo-functional test procedure

---

1. OTM = 1; CPE = 0; Enable[1:0] = 00;
2. for all k, test_in[k] = 1; CPE = 1;
3. for all k, fList[k] = Φ;
4. for all k, polarity[k] = total_No_RO(TOC[k]) mod2;
5. for (i = 0; i < 2; i++) {
   1. for all k, test_in[k] = 1; Enable[i] = 1;
   2. for all k, fault-detect (TOC[k], polarity[k], N, fList1[k] = Φ);
   3. if (fList1[k] ≠ Φ) {fList[k] = fList[k] ˆ fList1[k];} }
   4. Enable[i] = 0;
6. for all k, report fList[k];
7. end

---

The pseudo-functional test can be initialized in steps 1 through 2. The fault list of TOC[k], denoted as fList[k], can hold a list of detected faulty ring oscillators from each test. The fList[k] can be reset or initialized with the empty list, denote as Φ in step 3. The polarity[k] indicates whether a number of the TROs included in the TOC[k] are odd or even. If it is odd, the polarity[k]=1; otherwise, the polarity[k]=0. The mod 2 denotes a modulo-2 operation. The N mod 2 can return 1 and 0, if the N is odd and even, respectively. For purposes of the following discussion, type conversion from integer into binary is not explicitly mentioned when trivial. For example, the result of mod 2 operation which is an integer may be converted into binary before the assignment is made to the polarity[k] which is binary.

The pseudo-functional test is performed in step 5. In one embodiment, in order to test both the functional and bypass paths, the steps 5.1 through 5.3 are repeated twice. The TROs are enabled or disabled in step 5.1 depending on the Enable[i], and the test is performed in step 5.2. In the first test execution, for example, the TROs enabled by the Enable[0] are tested in the TOC[k]. Thus, the test path includes the functional path of enabled TROs and the bypass of disabled TROs. Similarly, in the second test execution, the enable signals can be complemented so that the TROs which were enabled are disabled and a vice versa. The fault-detect test procedure in step 5.2 determines the detected fault list for the given TOC[k], polarity and a number of oscillations (N) to be performed in the test. After the test, the result is reported in the fList1[k]. In one embodiment, the fList1[k] contains the test result of TOC[k] from each test. In one embodiment, the list of faults included in the fList1[k] are concatenated to the fList[k] at the end of the test. The detected faults are accumulated in step 5.3 and the Enable [i] is reset in step 5.4.

Testing of both the functional path and the bypass with all TROs enabled and disabled, respectively, aids in detecting the even number of falsely bypassed or enabled ring oscillators because those faults can change the period or the delay of the hierarchical ring oscillators formed by the test access. If, for example, there were even number of falsely enabled TROs, the delay from the test_in[k] to the test_out[k] will be longer. The period of hierarchical ring oscillator can be lengthened by the same amount of delay. Similarly, the falsely disabled TROs can shorten the delay and the period.

One embodiment of the fault-detect test procedure is provided below.

--- fault-detect (TOC[k], polarity[k], N, fList)

---

1. inversion[k] = #disabled(TOC[k]) mod2;
2. acc_status[1:0] = 00;
3. for (n = 0; n < 2N; n++) { // pseudo-functional test
    // Fault-detection via functional path
    1. exp_test_out [k] = test_in[k] ⊕ inversion[k];
    2. Measure test_out[k] at steady-state;
    3. if( test_out[k] ⊕ exp_test_out[k]) { status[1:0] = 01; }
    4. else { status[1:0] = 00; }
    // Fault-detection via obc path
    5. if ( test_in[k] ) { exp_obc_out[k] = inversion[k]; }
    6. else { exp_obc_out[k] = polarity[k]; }
    7. Measure obc_out[k] at steady-state;
    8. if (exp_obc_out [k] ⊕ obc_out[k] ) { status[1:0] = 10; }
    9. else { status[1:0] = 00; }
    10. acc_status = acc_status | status[1:0];
    11. test_in [k] = test_in [k] ⊕ 1; } // end for
4. if ( acc_status ≠ 00 ) { fList = fList ̂ (k, acc_status); }
5. return fList;

---

The fault-detect test procedure tests and stores the detected faults. Whether the test_out[k] is the inversion of the test_in[k] is determined in step 1. The inversion can be determined by the number of disabled TROs in the TOC[k]. The inversion can be 1 and 0 if there are odd and even number of disabled TROs in the TOC[k], respectively. The acc_status stores the test result and is reset in step 2.

In step 3, the N number of oscillations can be measured for every transition at the test_out[k] and the obc_out[k]. In step 3.2, the test_out[k] is measured at steady state for every transition of the test_in[k] and compared to the expected test_out[k] obtained in step 3.1. The expected test_out[k], denoted as exp_test_out[k], can be determined by the exp_test_out[k]=test_in[k] ⊕ inversion[k], where the symbol ⊕ denotes the XOR function. If the measured test_out[k] is not the same as the expected, a fault can be concluded. In one embodiment, if a fault is detected, the status is set to the status=01.

Similarly, faults related to the Enable path that includes the inverter chain can be detected at the obc_out[k]. In one embodiment, the Enable path is continuously observed after each transition at steady-state and the expected obc_out [k], denoted as exp_obc_out[k], is determined by the number of inversions occurred in the obc chain. In one embodiment, the inversion at the obc_out in each TRO is caused by the osc_out=1. The osc_out depends on the Enable, test_in and polarity[k]. If the Enable=0, the osc_out=1 regardless of the test_in. Otherwise, the osc_out=~test_in at steady-state. Thus, if the test_in[k]=1, the osc_out of all enabled TROs can be logical 0 and hence the exp_obc_out[k]=inversion[k]. Otherwise, the osc_out of all TROs are logical 1 and the exp_obc_out[k]=polarity[k]. The obc_out[k] can be measured in step 3.7 and is compared to the expected obc_out[y] obtained in steps 3.5 and 3.6 for the test decision.

In one embodiment, the status is accumulated by combining the statuses using a bit-wise OR function. Note that the acc_status=11, if the faults are detected in both steps 3.3 and 3.8. Once the faults are detected, they remain detected until the fault-detection test procedure is terminated. In step 3.11, the test_in[k] is complemented and the test can continue for the N number of oscillations.

After the test is completed, the fList is returned unmodified if no fault is found or the status=00. Otherwise, the index of faulty TOC[k] and the accumulated final status are appended to the fList.

The same test can be achieved by the structural test, and is described below.

Testing of Ring Oscillators Via Structural Test

The structural test is a low cost test that is applied mainly to digital random logic. In the structural test, the internal registers (or flip-flops) are connected serially to form a test access called a scan chain. The scan chain is used to initialize the internal registers for the test and to observe the test results after they are captured. Since the internal registers can be initialized to any state by loading the scan chain, the structural test transforms the problem of testing sequential circuit into that of combinational. The structural test normally cannot directly be applied to the testing of ring oscillators due to the asynchronous feedback.

An advantage of the disclosed TRO in the structural test is the controlled asynchronous feedback. As far as the steady-state signal states are concerned, the feedback appears to be broken or non-existent. Thus, the TRO can be treated as a random logic without asynchronous feedback and tested with other random logic using the same structural test. Other advantages include an insignificant pattern count increase due to increase in the number of TRO in the TOC. Since the proposed test access serially connects the inverter chains included in the TOC, the test patterns that detect the faults on one TRO can detect faults on the many TROs included in the same TOC. That is, serially connected TROs can increase equivalent faults so that detection of one fault can lead to detection of potentially many equivalent faults with no extra effort.

Figure 11:
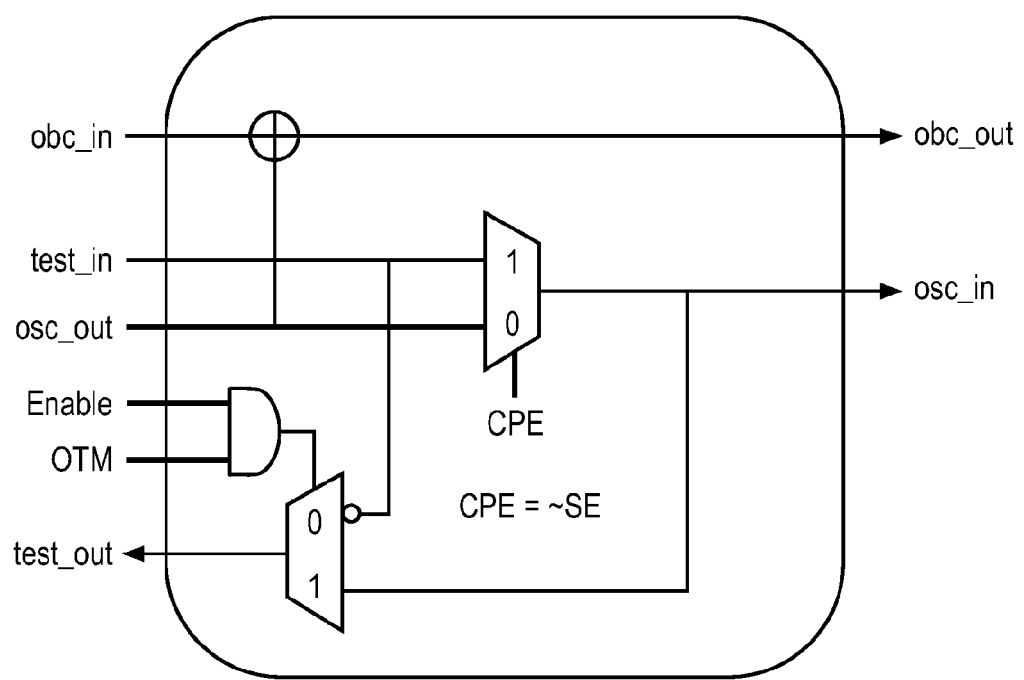
FIG. 11 illustrates a steady-state behavior model of a testable ring oscillator (TRO).

FIG. 11 illustrates one embodiment of a ring oscillator test structure in the steady-state. Note that the asynchronous feedback is broken when the CPE=1. In one embodiment, the steady-state behavior model shown in FIG. 11 is employed in automatic test pattern generation (ATPG), which can be carried out by the commercial ATPG tools. The structure test pattern often follows the structural test procedure provided below. For discussion, the structural test procedure is annotated with how testing of the ring oscillator to be incorporated.

---

Structural test procedure

---

1. STM = 1;
2. SE = 1; // CPE = 0;
3. Scan load/unload; // initialize test & check test result
4. SE = 0; // CPE = 1;

-continued

Structural test procedure

5. Force PI;
6. Measure PO; // check {test_out, obc_out}, if primary outputs
7. capture; // capture test result from {test_out, obc_out}
8. go to step 2 until done;
9. end The structural test is enabled when the structural test mode STM=1 in step 1. The scan chains are enabled in step 2 and the combinational system logic including the TRO is disabled when the SE=1. The OTM is assumed to be provided from the internal register so that it is tested and the CPE to be controlled by the scan enable (SE) during the structural test. The test_in and the obc_in is loaded for the test in step 3. After the test input is loaded, the SE is deactivated (SE=0) so that the ring oscillator logic is enabled. Necessary primary input (PI) are forced and the primary output (PO) are measured in step 5 and 6, respectively. The test inputs (test_in and obc_in) and the test outputs (test_out and obc_out) are forced and measured if they are connected to the PI and the PO during the structural test, respectively. Otherwise, they are captured into the internal registers in step 7 and the SE is activated (SE=1) to unload the test result in step 2. The captured test result is checked at the ATE for test decision in step 3. Since loading of the test input can be overlapped with unloading of the test result, they are merged in step 3.

The test setup discussed in the pseudo-functional test is achieved in step 4 and 5. The controlled asynchronous feedback forces the osc_in to be the same logical state of the test_in at steady-state or the osc_in=~Enable, if the Enable=0 and the osc_in=~test_in at steady-state. Alternatively, the same test setup is accomplished by the scan enable signal in step 2 at an expense of extra logic gates. If the SE=1, for example, it is used to force the CPE=0, the Enable[1:0]=00 and the test_in=1. Otherwise, the test control signals are determined by the system logic.

The structural test is often a mandatory test and can take longer test time than the proposed ring oscillator test. Since the ring oscillator test is overlapped with the other random logic test, the test cost of ring oscillator can be masked out or can be insignificant. Furthermore, the available test time can be utilized to improve diagnostic resolution of the ring oscillator test in some test applications, especially when the dedicated Enable can be available.

Thus, a cost efficient test solution to the problem of testing a large number of ring oscillators employed in the true random number generator for security key generation in the HDCP and other cryptography chips has been described. The disclosed scheme allows the structural test to be incorporated into testing of ring oscillators. The disclosed scheme also scales well with the increased problem size so that the test cost can be insignificant even if the number of ring oscillators is increased. The disclosed methodology, if applied to IP and end products, can reduce test cost, improve test quality and optimize engineering effort in test development.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An apparatus comprising at least one ring oscillator structure, the ring oscillator structure comprising:
    a ring oscillator having an inverter chain with an odd number of inverters connected serially, the ring oscillator operable to produce an oscillatory output responsive to receiving an oscillatory input; and
    a test structure coupled to the ring oscillator and configured to validate producing of an intended oscillating frequency of the oscillatory output within a specified jitter limit by the ring oscillator based on an observability chain input or a test input received at the test structure and oscillatory output received as a feedback signal from the ring oscillator, the observability chain input representing a signal for observing faults associated with enabling or disabling the feedback signal to the ring oscillator, the test input representing an input signal with the intended oscillating frequency.

2. The apparatus defined in claim 1, wherein the test structure is operable to reconfigure the ring oscillator into a testable structure to allow at least one of a structural test and a functional test of the ring oscillator.

3. The apparatus defined in claim 1, further comprising:
    a plurality of ring oscillator structures, the plurality of ring oscillator structures including the at least one ring oscillator structure, the plurality of ring oscillator structures connected in a serial chain to provide a signal path from a first ring oscillator structure to a last ring oscillator structure of the plurality of ring oscillator structures; and,
    a feedback path configured to feed back a test output of the last ring oscillator structure in the serial chain to the first ring oscillator structure of the plurality of ring oscillator structures, the test output in conjunction with a test input received by the first ring oscillator structure to control a frequency of the oscillatory output.

4. The apparatus defined in claim 3 further comprising a gate coupled to the first ring oscillator structure in the serial chain to conditionally activate the feedback path to feed back the test output of the last ring oscillator structure, responsive to receiving a feedback enable signal.

5. The apparatus defined in claim 3 further comprising an XOR gate configured to perform an XOR operation on the test output from the last ring oscillator structure and the test input received by the first ring oscillator structure.

6. The apparatus defined in claim 3, wherein one or more respective ring oscillators of the plurality of ring oscillator structures in the serial chain is selected for testing based on corresponding enable signals of the one or more respective ring oscillators.

7. The apparatus defined in claim 3, wherein the inverter chain contains an odd number of inverters along the signal path from a first ring oscillator structure to a last ring oscillator structure of the plurality of ring oscillator structures.

8. The apparatus defined in claim 1 further comprising an AND gate, an output, of the AND gate being coupled to an input of the ring oscillator, the AND gate conditionally activating or deactivating the feedback path responsive to a feedback enable signal.

9. The apparatus defined in claim 1 wherein the test structure receives a plurality of control signals.

10. The apparatus defined in claim 9 wherein at least one of the plurality of control signals is a test control signal obtained from a register internal to the apparatus.

11. The apparatus defined in claim 9, wherein at least one of the plurality of control signals is a ring oscillator test mode signal that determines whether the ring oscillator is in functional mode for providing a free-running oscillatory output or in test mode for producing the oscillatory output at a specified frequency.

12. A random number generator for use in secret key generation in High Definition Content Protection (HDCP), the random number generator comprising at least one ring oscillator structure, the ring oscillator structure comprising:
a ring oscillator having an inverter chain with an odd number of inverters connected serially, the ring oscillator operable to produce an oscillatory output responsive to receiving an oscillatory input; and
a test structure coupled to the ring oscillator and configured to validate producing of an intended oscillating frequency of the oscillatory output within a specified jitter limit by the ring oscillator based on an observability chain input or a test input received at the test structure and the oscillatory output received as a feedback signal from the ring oscillator, the observability chain input representing a signal for observing faults associated with enabling or disabling the feedback signal to the ring oscillator, the test input representing an input signal with the intended oscillating frequency.

13. An apparatus comprising:
a plurality of ring oscillator structures connected in a serial chain to provide a signal path from a first ring oscillator structure to a last ring oscillator structure of the plurality of ring oscillator structures, each ring oscillator structure of the plurality of ring oscillator structures comprising:
a ring oscillator having an inverter chain with inverters connected serially, the ring oscillator operable to produce a first oscillatory output responsive to receiving an oscillatory input, and
a ring oscillator test structure coupled to the ring oscillator, the ring oscillator test structure configured to receive an observability chain input or a test input and to receive a second oscillatory output as a feedback signal from the ring oscillator, the ring oscillator test structure being operable to reconfigure the ring oscillator into a testable structure to enable at least one respective test of a structural test and a functional test of the ring oscillator, the respective test to validate whether the ring oscillator produces an intended oscillating frequency; and
a gate coupled to the first ring oscillator structure in the serial chain to conditionally activate a feedback path to feedback a test output of the last ring oscillator test structure to the plurality of ring oscillator structures at the first ring oscillator structure in the serial chain, via the feedback path, the conditional activation responsive to a feedback enable signal, the test output being fed back to the plurality of ring oscillator structures for use with a test input received by the first ring oscillator structure to control a frequency of an oscillatory output of the last ring oscillator structure of the plurality of ring oscillator structures.

14. The apparatus defined in claim 13 further comprising an XOR gate configured to perform an XOR operation on the test output from the last ring oscillator structure and the test input received by the first ring oscillator structure.

15. The apparatus defined in claim 13 wherein one or more respective ring oscillators of the plurality of ring oscillator structures in the serial chain is selected for testing, based on corresponding enable signals of the one or more respective ring oscillators.

16. The apparatus defined in claim 13, wherein the serial chain contains an odd number of inverters along the signal path from a first ring oscillator structure to a last ring oscillator structure of the plurality of ring oscillator structures.

17. The apparatus defined in claim 13 further comprising gate logic coupled to the plurality of ring oscillator structures, the gate logic configured to disable feedback of at least one of the plurality of ring oscillators in steady state for a structural test.

18. A random number generator for use in secret key generation in cryptography, the random number generator comprising:
a plurality of ring oscillator structures connected in a serial chain to provide a signal path from a first ring oscillator structure to a last ring oscillator structure of the plurality of ring oscillator structures, each ring oscillator structure of the plurality of ring oscillator structures comprising:
a ring oscillator having an inverter chain with inverters connected serially, the ring oscillator operable to produce a first oscillatory output responsive to receiving an oscillatory input, and
a ring oscillator test structure coupled to the ring oscillator, the ring oscillator test structure configured to receive a second oscillatory output as a feedback signal from the ring oscillator, the ring oscillator test structure configured to validate producing of an intended oscillating frequency of the first oscillatory output within a specified jitter limit by the ring oscillator based on receive an observability chain input or a test input received at the ring oscillator test structure, the observability chain input representing a signal for observing faults associated with enabling or disabling the feedback signal to the ring oscillator, the test input representing an input signal with the intended oscillating frequency, the ring oscillator test structure being operable to reconfigure the ring oscillator into a testable structure to enable at least one respective test of a structural test and a functional test of the ring oscillator, the respective test to validate whether the ring oscillator produces an intended oscillating frequency; and
a gate coupled to the first ring oscillator structure in the serial chain to conditionally activate a feedback path to feedback a test output of the last ring oscillator test structure to the plurality of ring oscillator structures at the first ring oscillator structure in the serial chain, via the feedback path, the conditional activation responsive to a feedback enable signal, the test output is fed back to the plurality of ring oscillator structures for use with a test input received by the first ring oscillator structure to control a frequency of an oscillatory output of the last ring oscillator structure of the plurality of ring oscillator structures.

19. An apparatus comprising at least one ring oscillator structure, the ring oscillator structure comprising:
a ring oscillator comprising an inverter chain with an odd number of inverters connected serially, the ring oscillator operable to produce an oscillatory output responsive to receiving an oscillatory input; and
a feedback path configured to receive the oscillatory output from the inverter chain and to provide the oscillatory input to the inverter chain, the feedback path comprising:
a test structure configured to receive the oscillatory output as a feedback signal from the ring oscillator and to receive an observability chain input or a test input, the observability chain input representing a signal for observing faults associated with enabling or disabling the feedback signal to the ring oscillator, the test input representing an input signal with the intended oscillating frequency; and a gating element to conditionally activate or deactivate the feedback path responsive to a feedback enable signal.

\* \* \* \* \*

UNITED STATES PATENT AND TRADEMARK OFFICE
CERTIFICATE OF CORRECTION

PATENT NO. : 8,841,974 B2
APPLICATION NO. : 13/605708
DATED : September 23, 2014
INVENTOR(S) : Chinsong Sul et al.

It is certified that error appears in the above-identified patent and that said Letters Patent is hereby corrected as shown below:

In the Claims

In claim 3, at column 14, line 30, replace --and,-- with "and".
In claim 18, at column 16, line 28, after "based on," replace --receive-- with "receiving".

Signed and Sealed this
Ninth Day of February, 2016

Michelle K. Lee
*Director of the United States Patent and Trademark Office*